(12) United States Patent
She et al.

(10) Patent No.: US 10,867,664 B1
(45) Date of Patent: Dec. 15, 2020

(54) SENSE AMPLIFIER FOR FLASH MEMORY DEVICES

(71) Applicant: Yangtze Memory Technologies Co., Ltd., Wuhan (CN)

(72) Inventors: Min She, Wuhan (CN); Qiang Tang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/711,432

(22) Filed: Dec. 12, 2019

Related U.S. Application Data

(63) Continuation of application No. PCT/CN2019/114963, filed on Nov. 1, 2019.

(51) Int. Cl.
| | | |
|---|---|---|
| G11C 7/02 | (2006.01) | |
| G11C 11/4091 | (2006.01) | |
| G11C 7/10 | (2006.01) | |
| G11C 7/06 | (2006.01) | |
| G11C 11/4074 | (2006.01) | |

(52) U.S. Cl.
CPC .......... G11C 11/4091 (2013.01); G11C 7/065 (2013.01); G11C 7/1006 (2013.01); G11C 11/4074 (2013.01)

(58) Field of Classification Search
CPC ... G11C 11/4091; G11C 7/065; G11C 7/1006; G11C 11/4074
USPC ................................................. 365/205, 207
See application file for complete search history.

(56) References Cited

U.S. PATENT DOCUMENTS

| 5,291,445 | A | 3/1994 | Miyaoka | |
|---|---|---|---|---|
| 6,097,638 | A * | 8/2000 | Himeno | G11C 16/26 365/185.25 |
| 6,225,834 | B1 * | 5/2001 | Gang | G11C 7/065 327/51 |
| 7,184,356 | B2 | 2/2007 | Noguchi | |
| 7,460,387 | B2 * | 12/2008 | Matick | G11C 11/4091 365/149 |
| 7,663,929 | B2 | 2/2010 | Ogawa | |
| 8,649,223 | B2 * | 2/2014 | Maeda | G11C 16/26 365/185.21 |
| 8,912,825 | B2 * | 12/2014 | Chen | G11C 7/065 327/52 |
| 9,070,424 | B2 | 6/2015 | Youn | |
| 9,147,480 | B2 * | 9/2015 | Chen | G11C 16/26 |

(Continued)

FOREIGN PATENT DOCUMENTS

| CN | 102394094 A | 3/2012 |
|---|---|---|
| CN | 103531235 A | 1/2014 |

(Continued)

*Primary Examiner* — Viet Q Nguyen
(74) *Attorney, Agent, or Firm* — Winston Hsu

(57) ABSTRACT

A sense amplifier includes a sense circuit coupled to a bitline and a sense node, a charge circuit coupled to the sense node and the sense circuit, a first current control transistor, an inverter circuit having a first latch node and a second latch node, coupled to the first current control transistor, and an input circuit coupled to the first latch node, the second latch node and the sense node. The first current control transistor includes a first terminal coupled to the system voltage source, a second terminal coupled to the inverter circuit, and a control terminal configured to receive a current control signal. The first current control transistor is a P-type transistor.

18 Claims, 9 Drawing Sheets

(56) References Cited

U.S. PATENT DOCUMENTS

| | | |
|---|---|---|
| 9,972,371 B2 | 5/2018 | Cha |
| 10,290,340 B1 | 5/2019 | Jung |
| 10,297,326 B2 | 5/2019 | Kamata |
| 2003/0057520 A1* | 3/2003 | Kawasumi ............ G11C 7/065 257/553 |
| 2005/0024974 A1 | 2/2005 | Noguchi |
| 2015/0228333 A1 | 8/2015 | Chou |
| 2019/0007000 A1 | 1/2019 | Jeong |

FOREIGN PATENT DOCUMENTS

| | | |
|---|---|---|
| CN | 106898382 A | 6/2017 |
| CN | 107516541 A | 12/2017 |
| CN | 108181071 A | 6/2018 |
| EP | 0547640 A3 | 8/1997 |
| EP | 0 758 127 B1 | 9/2001 |
| EP | 0 776 012 B1 | 10/2003 |
| WO | 8203513 A1 | 10/1982 |

* cited by examiner

SENSE AMPLIFIER FOR FLASH MEMORY DEVICES

CROSS REFERENCE TO RELATED APPLICATIONS

This application is a continuation of International Application No. PCT/CN2019/114963, filed on Nov. 1, 2019, which is incorporated by reference herein in its entirety.

BACKGROUND OF THE INVENTION

1. Field of the Invention

The present invention is related to a sense amplifier, especially to a sense amplifier for flash memory devices.

2. Description of the Prior Art

A non-volatile memory is a memory that can retain its stored data for an extended period without the application of power. Flash memory devices have developed into a popular type of non-volatile memory for a wide range of applications. Flash memory devices are commonly used in electronic systems, such as personal computers, digital cameras, digital media players, digital recorders, vehicles, wireless devices, cellular phones, and removable memory modules, and the uses for flash memory continue to expand.

A flash memory device uses one of the two basic architectures known as NOR Flash and NAND Flash. Typically, an array of memory cells for NAND flash memory devices is arranged such that memory cells of a string are connected together in series, source to drain. A flash memory can comprise a memory array, which includes a large number of floating gate transistors. A NAND architecture array arranges its array of flash memory cells in a matrix of rows and columns, as a conventional NOR array does, so that the gates of each flash memory cell of the array are coupled by rows to word lines. However, unlike NOR, each memory cell is not directly coupled to a source line and a column bitline. Instead, the memory cells of the array are arranged together in strings, typically of 8, 16, 32, or more. The memory cells in the string are coupled together in series, source to drain, between a common source line and a column bitline.

Sensing the content stored in the flash memory cells may be the most important operation in flash memory devices. The circuit which accomplishes this purpose is known as the sense amplifier. A sense amplifier decides the content of the flash memory cell by comparing the voltage drop caused by current drawn by the selected memory cell from the memory cell matrix with a predetermined voltage level. The design of sense amplifier circuit is most significant in the readpath of flash memory devices because it decides the memory content. If in a case where the sense amplifier does not interpret the memory cell current correctly, it would lead to erroneous bit at the output. Hence, the requirement for sense amplifiers are to have robustness towards any variation in temperature, supply voltage and process.

SUMMARY OF THE INVENTION

An embodiment provides a sense amplifier including a sense circuit coupled to a bitline and a sense node, a charge circuit coupled to the sense node and the sense circuit, a first current control transistor, an inverter circuit having a first latch node and a second latch node, coupled to the first current control transistor, and an input circuit coupled to the first latch node, the second latch node and the sense node. The first current control transistor includes a first terminal coupled to the system voltage source, a second terminal coupled to the inverter circuit, and a control terminal configured to receive a current control signal. The first current control transistor is a P-type transistor.

An embodiment provides a sense amplifier including a sense circuit coupled to a bitline and a sense node, a charge circuit coupled to the sense node and the sense circuit, a first current control transistor, a second current control transistor, an inverter circuit having a first latch node and a second latch node, coupled to the first current control transistor and the second current control transistor, and an input circuit coupled to the first latch node, the second latch node and the sense node. The first current control transistor includes a first terminal coupled to the system voltage source, a second terminal coupled to the inverter circuit, and a control terminal configured to receive a current control signal. The second current control transistor includes a first terminal coupled to the system voltage source, a second terminal coupled to the inverter circuit, and a control terminal configured to receive a current control signal. The first current control transistor and the second current control transistor are P-type transistors.

An embodiment provides a sense amplifier including a sense circuit coupled to a bitline and a sense node, a charge circuit coupled to the sense node and the sense circuit, a first current control transistor, a second current control transistor, an inverter circuit having a first latch node and a second latch node and an input circuit coupled to the first latch node, the second latch node and the sense node. The inverter circuit includes the first current control transistor and the second current control transistor. A first current control transistor includes a first terminal, a second terminal coupled to a first latch node, and a control terminal configured to receive a current control signal. A second current control transistor includes a first terminal, a second terminal coupled to a second latch node and a control terminal configured to receive the current control signal. The first current control transistor and the second current control transistor are P-type transistors.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
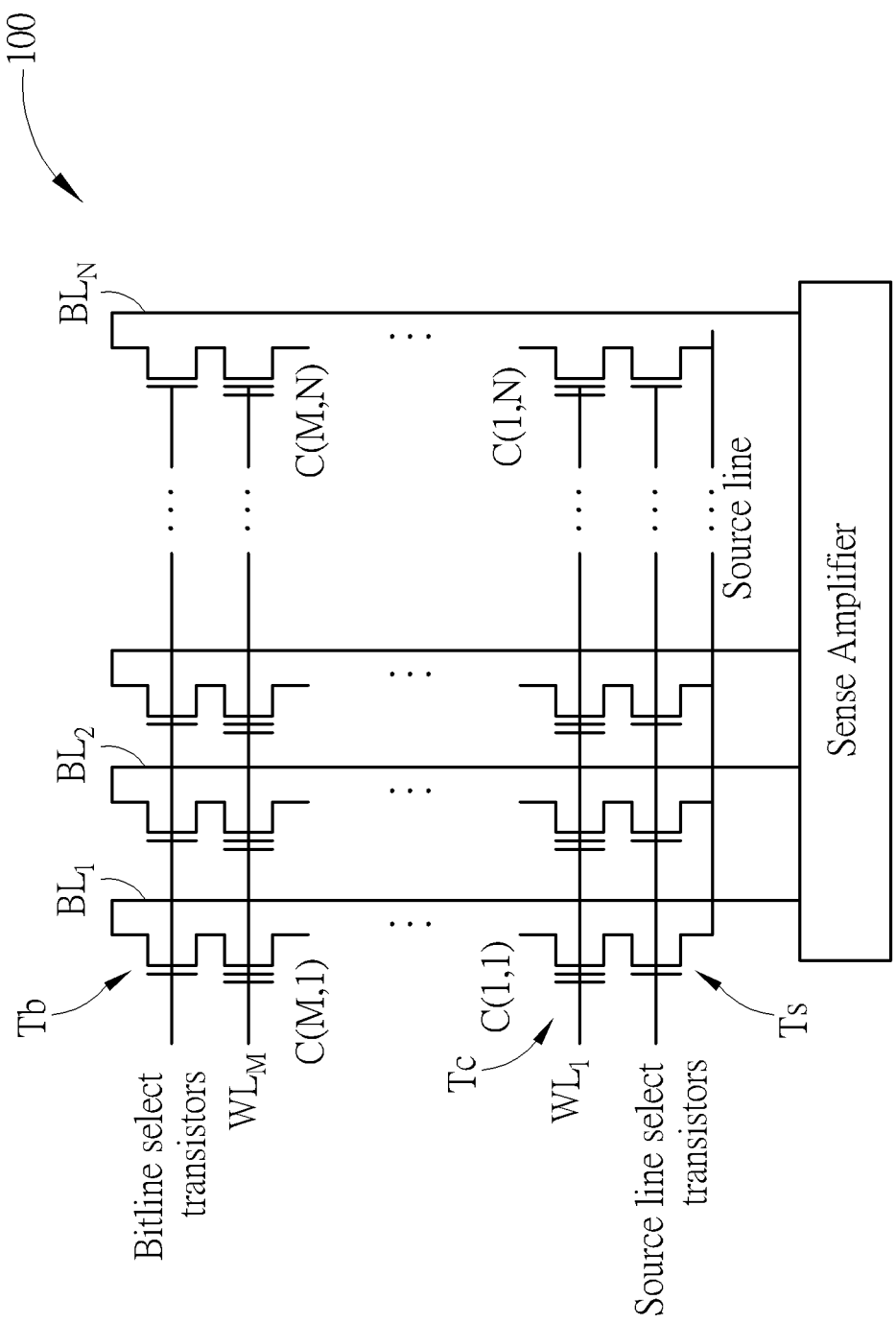
FIG. 1 is a diagram of a flash memory device of an embodiment.

FIG. 1 shows a flash memory device 100 of an embodiment. The flash memory device 100 comprises a plurality of memory cells C(1,1) to C(M,N), where M and N are positive integers. In some embodiments of the present invention, the non-volatile memory device 100 can be a NAND type flash memory. N memory cells can be coupled to the same wordline and M memory cells can be coupled to the same bitline. For example, a row of memory cells C(1,1) to C(1,N) can be coupled to a wordline $WL_1$, and a row of memory cells C(M,1) to C(M,N) can be coupled to a wordline $WL_M$. A column of memory cells C(1,1) to C(M,1) can be coupled to a bitline $BL_1$, and a column of memory cells C(M,1) to C(M,N) can be coupled to a bitline $BL_N$. One terminal of a memory column is coupled to a bitline via a bitline select transistor Tb corresponding to that memory column and the other terminal is coupled to a source line via a source line select transistor Ts. The bitlines $BL_1$ to $BL_N$ are coupled to sense amplifier that detect the state of a target memory cell by sensing voltage or current on a selected bitline $BL_n$, where n is a positive integer between 1 and N inclusively.

Flash programming involves applying one or more programming pulses to a wordline, for example the wordline $WL_m$ in FIG. 1, where m is an integer between 1 and M. This is to control the gate of each memory cell C(m,1) to C(m,N). For example, programming pulses may start at 15V and increase for each subsequent programming pulse. This programming method is commonly known incremental step pulse programming (ISPP). While a programming pulse is applied to the wordline $WL_m$, a voltage is also applied to substrate having the channels of these memory cells resulting in a charge transfer from the channel to the floating gates of the selected memory cells. Electrons from the channels can be injected into the floating gates through direct injection or Fowler-Nordheim tunneling. Therefore, in a programmed state the threshold voltage is usually greater than zero.

Sensing the content stored in the flash memory cells is also a necessary operation in flash memory devices. The circuit that accomplishes this purpose is known as the sense amplifier. A sense amplifier decides the content of the flash memory cell by comparing the voltage drop caused by current drawn by the selected memory cell from the memory cell matrix with a predetermined voltage level. However, sense amplifiers commonly used to determine whether the selected cell is in programmed state or erased state are sensitive to temperature, supply voltage and semiconductor process. In other words, variation in operating temperature, manufacturing process and power supply voltage may cause a sense amplifier to misjudge the state of the selected memory cell. This may cause erroneous reading of the memory cells. Therefore, it demands a new sense amplifier design to alleviate this problem.

Figure 2:
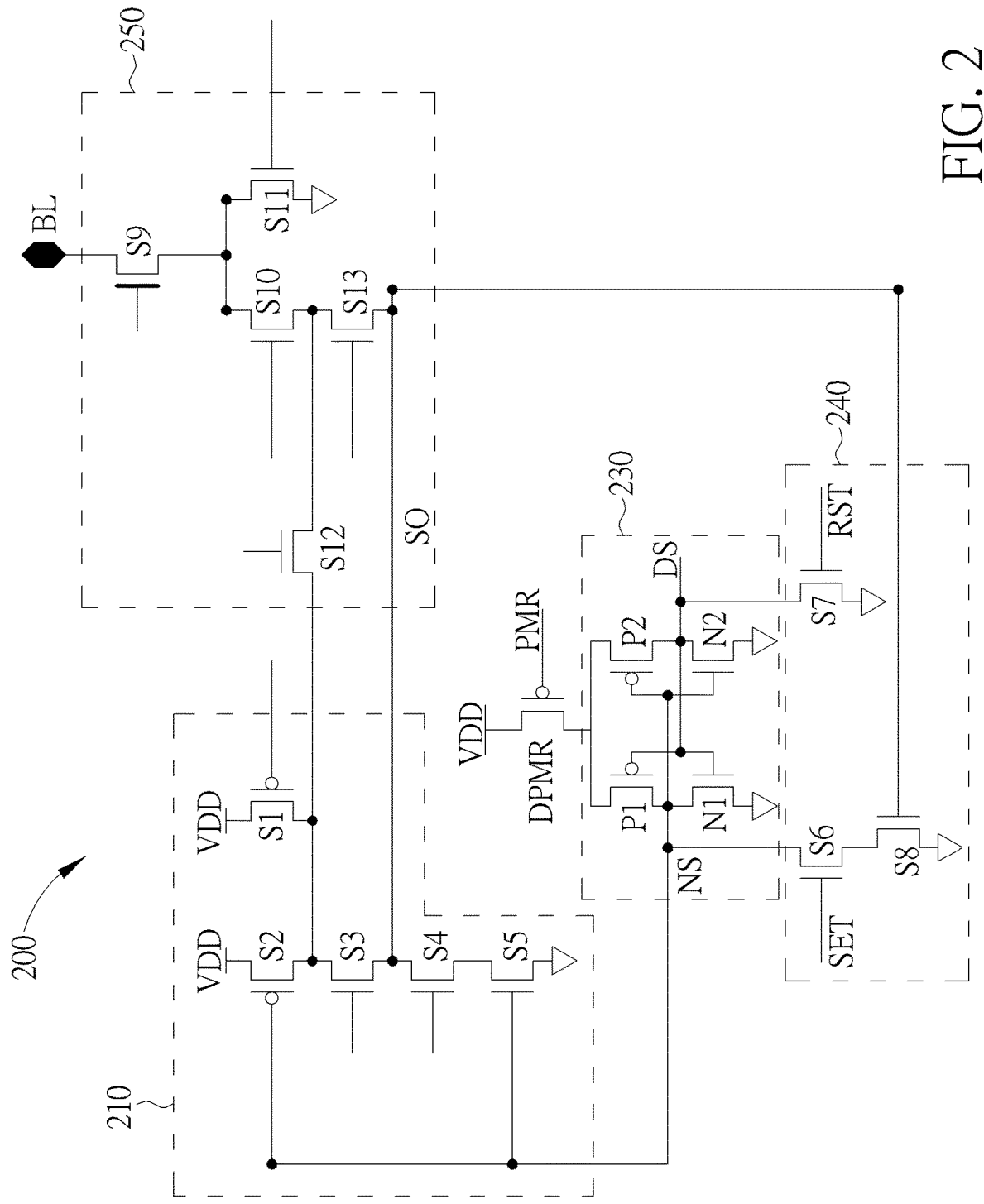
FIG. 2 is a sense amplifier of an embodiment of the present invention.

FIG. 2 is a sense amplifier 200 of an embodiment. The sense amplifier 200 comprises a charge circuit 210, a first current control transistor DPMR, an inverter circuit 230, an input circuit 240, and a sense circuit 250 coupled to a bitline BL and a sense node SO. The charge circuit 210 comprises a first switch S1, a second switch S2, a third switch S3, a fourth switch S4, and a fifth switch S5. The first switch S1 comprises a first end coupled to a system voltage source VDD, and a second end coupled to the sense circuit 250. The second switch S2 comprises a first end coupled to the system voltage source VDD, a second end coupled to the second end of the first switch S1, and a control end. The third switch S3 comprises a first end coupled to the second end of the second switch S2, and a second end coupled to the sense node SO. The fourth switch S4 comprises a first end coupled to the sense node SO, and a second end. The fifth switch S5 comprises a first end coupled to the second end of the fourth switch S4, a second end coupled to a voltage ground GND (represented by a triangle in the figures), and a control end coupled to the control end of the second switch S2. The first switch S1 and the second switch S2 are P-type transistors. The third switch S3, the fourth switch S4, and the fifth switch S5 are N-type transistors.

The first current control transistor DPMR comprises a first terminal coupled to the system voltage source VDD, a second terminal, and
a control terminal configured to receive a current control signal PMR. The first current control transistor DPMR is a P-type transistor.

The inverter circuit 230 comprises a first P-type transistor P1, a first N-type transistor N1, a second P-type transistor P2 and a second N-type transistor N2. The first P-type transistor P1 comprises a first terminal coupled to the second terminal of the first current control transistor DPMR, a second terminal coupled to a first latch node NS, and a control terminal coupled to a second latch node DS. The first N-type transistor N1 comprises a first terminal coupled to the first latch node NS, a second terminal coupled to the voltage ground GND, and a control terminal coupled to the second latch node DS. The second P-type transistor P2 comprises a first terminal coupled to the second terminal of the first current control transistor DPMR, a second terminal coupled to the second latch node DS, and a control terminal coupled to the first latch node NS. The second N-type transistor N2 comprises a first terminal coupled to the second latch node DS, a second terminal coupled to the voltage ground GND and a control terminal coupled to the first latch node NS.

The input circuit 240 comprises a sixth switch S6, a seventh switch S7, and an eighth switch S8. The sixth switch S6 comprises a first end coupled to the first latch node NS, and a second end. The seventh switch S7 comprises a first end coupled to the second latch node DS, and a second end coupled to the voltage ground GND. The eighth switch comprises a first end coupled to the second end of the sixth switch S6, a second end coupled to the voltage ground GND, and a control end coupled to the sense node SO. The sixth switch S6, the seventh switch S7 and the eighth switch S8 are N-type transistors.

The sense circuit 250 comprises a ninth switch S9, a tenth switch S10, an eleventh switch S11, a twelfth switch S12, and a thirteenth switch S13. The ninth switch S9 comprises a first end coupled to the bitline BL, and a second end. The tenth switch comprises a first end coupled to the second end of the ninth switch S9, and a second end. The eleventh switch S1b comprises a first end coupled to the second end of the ninth switch S9, and a second end coupled to the voltage ground GND. The twelfth switch comprises a first end coupled to the second end of the first switch S1, and a second end coupled to the second end of the tenth switch S10. The thirteenth switch comprises a first end coupled to the second end of the tenth switch S10, and a second end coupled to the sense node SO. The ninth switch S9, the tenth switch S10, the eleventh switch S11, the twelfth switch S12 and the thirteenth switch S13 are N-type transistors.

Figure 3:
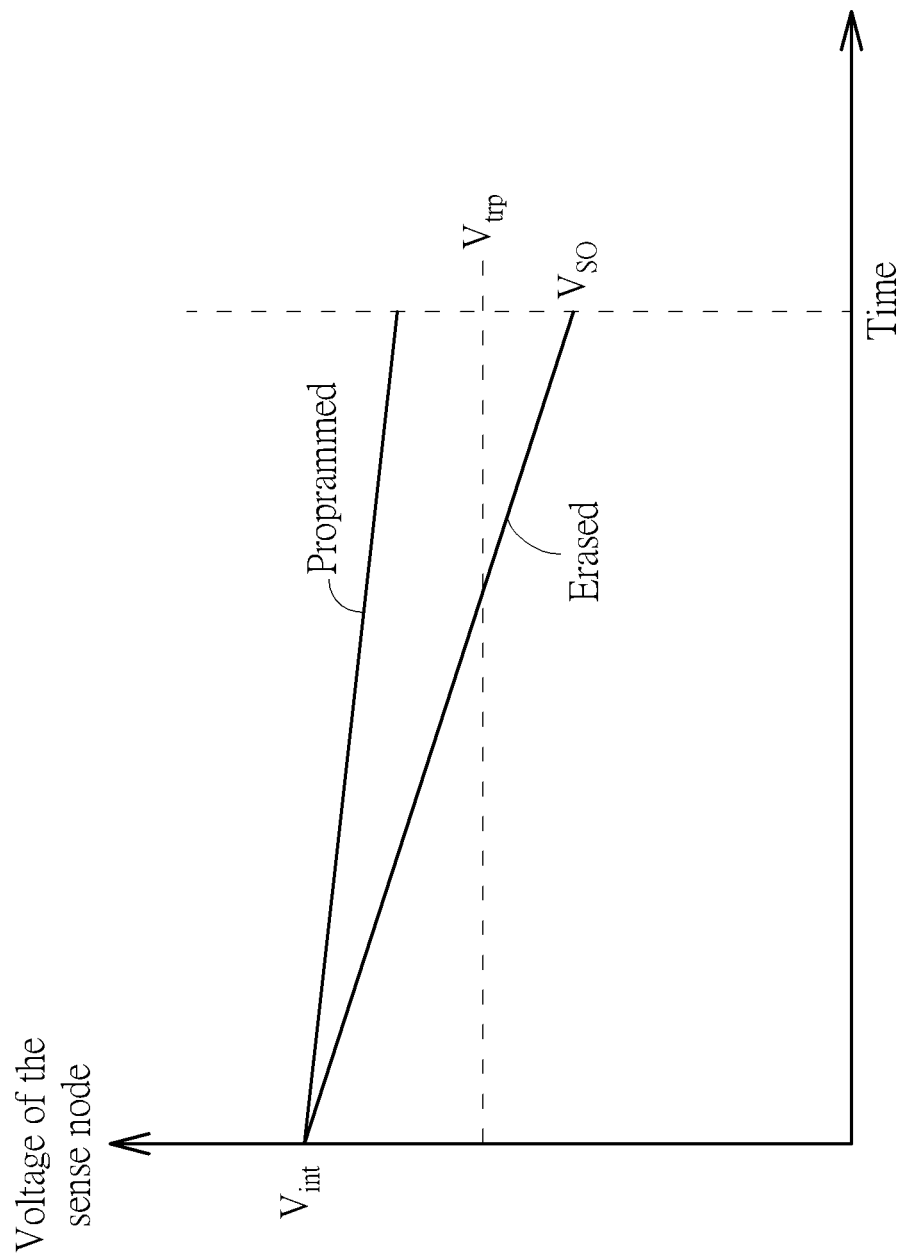
FIG. 3 is a diagram of the voltage development of the sense node during the sensing operation.

FIG. 3 is a diagram of the voltage development of the sense node during the sensing operation. Initially, the voltage of the sense node is charged to an initial voltage $V_{int}$ which can be lower than or equal to the system voltage VDD. This is done by turning on the charge circuit 210. After the sense node is charged, the charge circuit 210 is turned off and the sense node begins to discharge through the bitline coupled to the sense circuit 250. After a certain development time, the voltage of the sense node $V_{so}$ would drop to a steady level. At this point, if the voltage of the sense node $V_{so}$ is higher than a trip point voltage $V_{trp}$, the selected memory cell is determined to be in the programmed state. If the voltage of the sense node $V_{so}$ is lower than the trip point voltage $V_{trp}$, the selected memory cell is determined to be in the erased state.

The trip point voltage $V_{trp}$ is a sense voltage of the inverter circuit 230 that can change the voltage of the first latch node NS. Also, the voltage of the second latch node DS is always complementary to the first latch node NS. For example, if the voltage of the sense node $V_{so}$ is higher than a trip point voltage $V_{trp}$, the voltage of the first latch node NS would change from high to low when given a voltage pulse to the sixth switch S6. If the sense voltage $V_{so}$ is lower than the trip point voltage $V_{trp}$, the voltage of the first latch node NS would stay unchanged.

As shown by the circuit configuration, the level of trip point voltage $V_{trp}$ can be determined by the device threshold voltage of the eighth switch S8. It can also be determined by the device threshold voltages and the gate-source voltages of the first P-type transistor P1 and of the second P-type transistor P2. Through adjusting a current control signal PMR, a first current control transistor DPMR can control the current through the inverter circuit 230, and by which the trip point voltage $V_{trp}$ can be adjusted. For example, a 5 μA current would result in raising the trip point voltage $V_{trp}$ than a 2 μA current. In other words by controlling the current through adjusting the current control signal PMR, the trip point voltage $V_{trp}$ can be shifted according to the requirement of flash memory devices.

In the prior art, the sense node SO is usually precharged to the system voltage VDD before the sensing operation. In the embodiment, by coupling control terminal of the eighth switch S8 together with the second terminal of the third switch S3 to the sense node SO, the sense node SO would be precharged to the initial voltage $V_{int}$ instead the system voltage VDD. The third switch S3 is used to control the initial voltage $V_{int}$ of the sense node SO. Because the $V_{int}$ can be controlled in a way that it depends on the device threshold voltage of the eighth switch S8 and a bias voltage which is independent of variation in process and temperature, the initial voltage $V_{int}$ can also be adjusted according to the trip point voltage $V_{trp}$. This practice can achieve better sensing margin and alleviate the possibility of misjudging the state of the selected memory cell.

Figure 4:
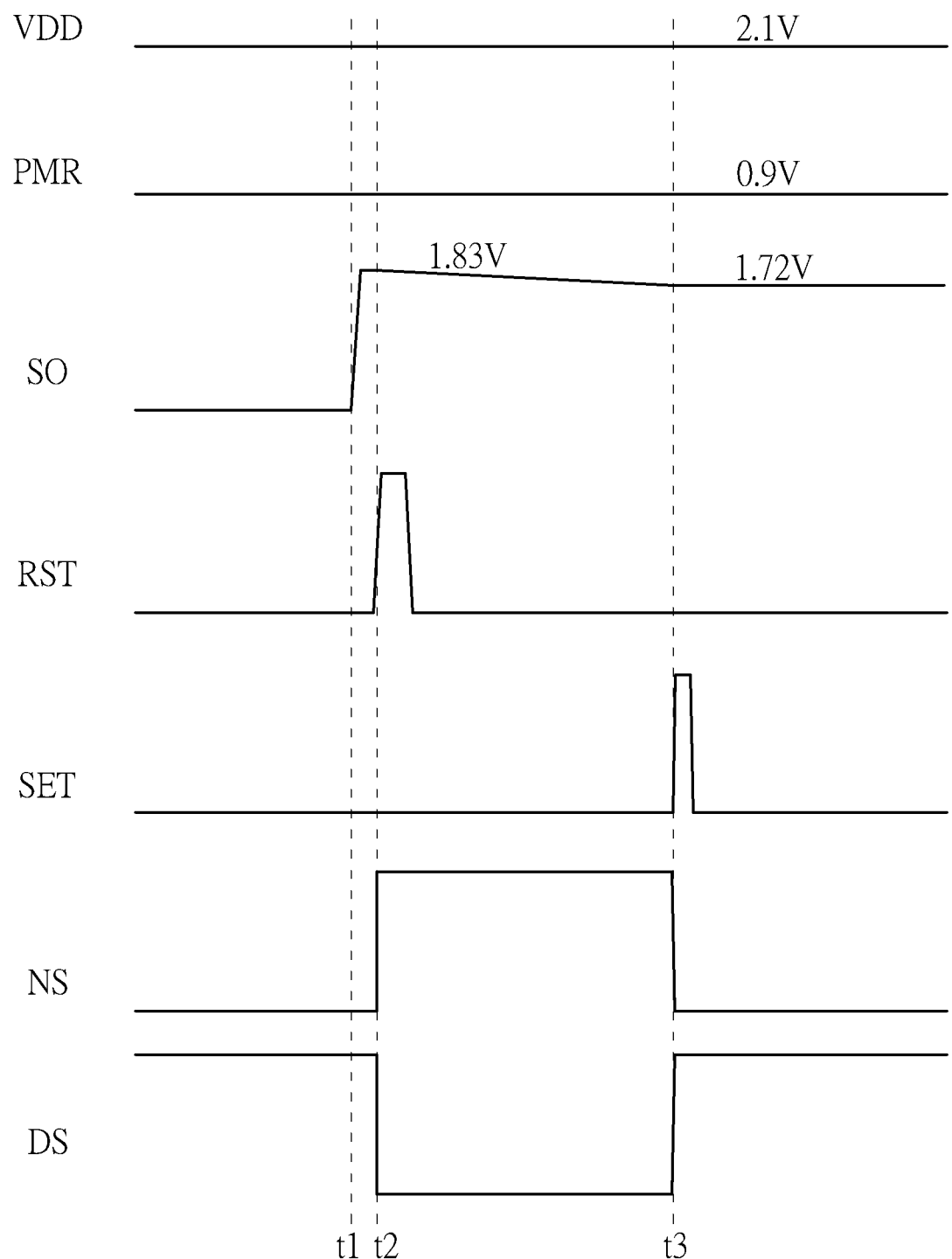
FIG. 4 is an operating signal waveform diagram of the sense amplifier of FIG. 2.

FIG. 4 is an operating signal waveform diagram of the sense amplifier of FIG. 2. In this embodiment, the selected memory cell is in the programmed state. The system voltage VDD is set to 2.10V and the voltage of the current control signal is set to 0.9V throughout the operation. The range of the trip point voltage can be for example, between 0.8V to 1.1V. At time t1, the charge circuit 210 starts to charge the sense node so as to raise the voltage of the sense node $V_{so}$. After charging the sense node to the initial voltage $V_{int}$, the selected memory cell coupled to the bitline BL, which is coupled to the sense circuit 250, would begin to discharge the sense node SO. It causes the voltage of the sense node $V_{so}$ to drop, for example, from 1.83V to 1.72V.

At time t2, a short pulse signal RST is given to the seventh switch S7 causing the voltage of the first latch node NS to flip from low to high and the voltage of the second latch node DS to flip from high to low. At time t3, when the sense node SO is discharged to a steady level, for example 1.72V, a short pulse signal SET is given to the sixth switch S6 causing the voltage of the first latch node NS to flip from high to low and the voltage of the second latch node DS to flip from low to high. The result indicates that the voltage of the sense node SO is above the trip point voltage $V_{trp}$, which indicates the selected memory cell is in the programmed state.

Figure 5:
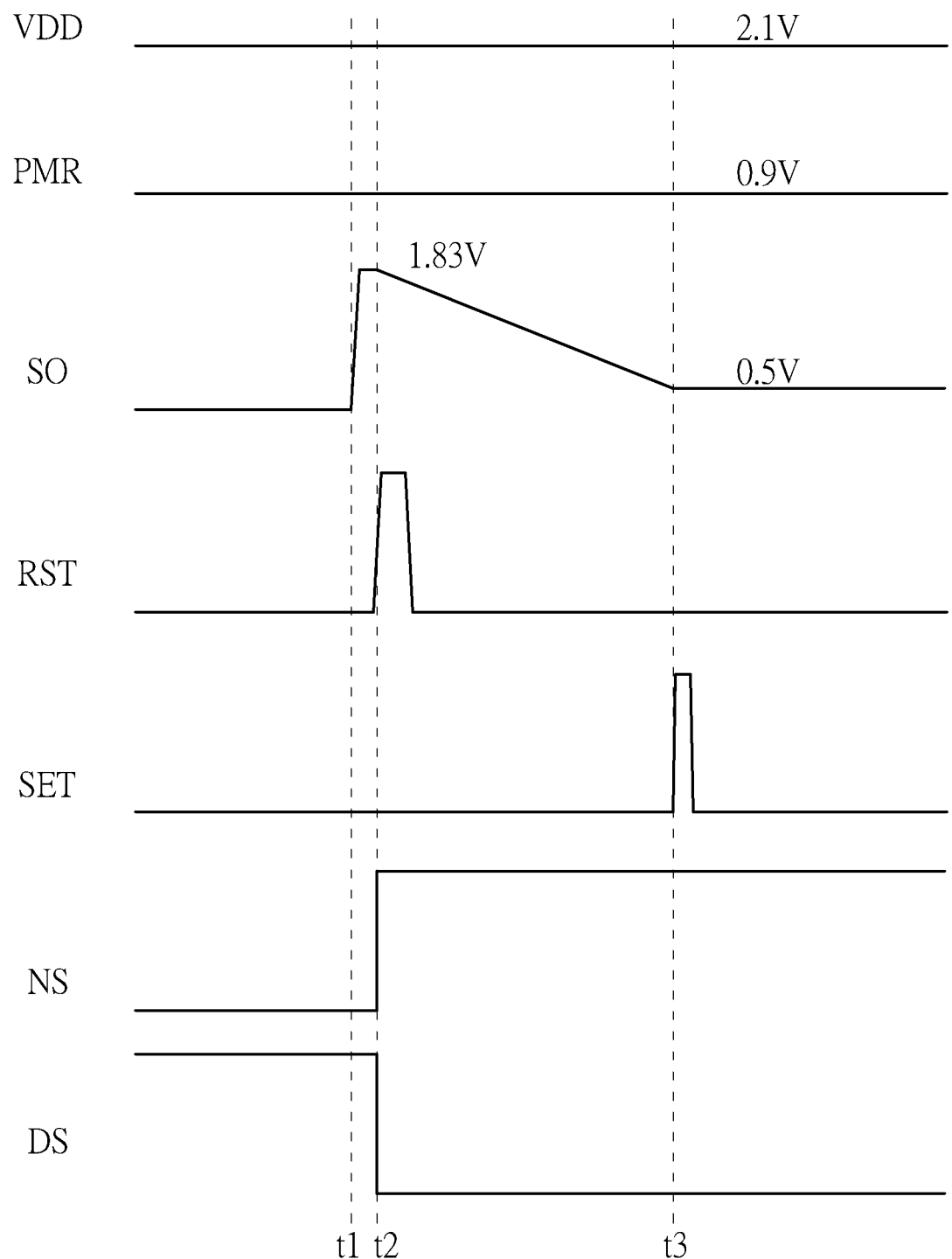
FIG. 5 is another operating signal waveform diagram of the sense amplifier of FIG. 2.

FIG. 5 is another operating signal waveform diagram of the sense amplifier of FIG. 2. In this embodiment, the selected memory cell is in the erased state. The system voltage VDD is set to 2.10V and the voltage of the current control signal is set to 0.9V throughout the operation. The range of the trip point voltage can be for example, between 0.8V to 1.1V. At time t1, the charge circuit 210 starts to charge the sense node so as to raise the voltage of the sense node $V_{so}$. After charging the sense node to the initial voltage $V_{int}$, the selected memory cell coupled to the bitline BL which is coupled to the sense circuit 250 would begin to discharge the sense node SO. It causes the voltage of the sense node $V_{so}$ to drop for example, from 1.83V to 0.5V.

At time t2, a short pulse signal RST is given to the seventh switch S7 causing the voltage of the first latch node NS to flip from low to high and the voltage of the second latch node DS to flip from high to low. At time t3, when the sense node SO is discharged to a steady level, for example 0.5V, a short pulse signal SET is given to the sixth switch S6. Because the voltage of the sense node $V_{so}$ is below the trip point voltage $V_{so}$, the voltage of the first latch node NS and the voltage of the second latch node DS would stay the same. The result indicates that the voltage of the sense node SO is below the trip point voltage $V_{trp}$, which indicates the selected memory cell is in the erased state.

Figure 6:
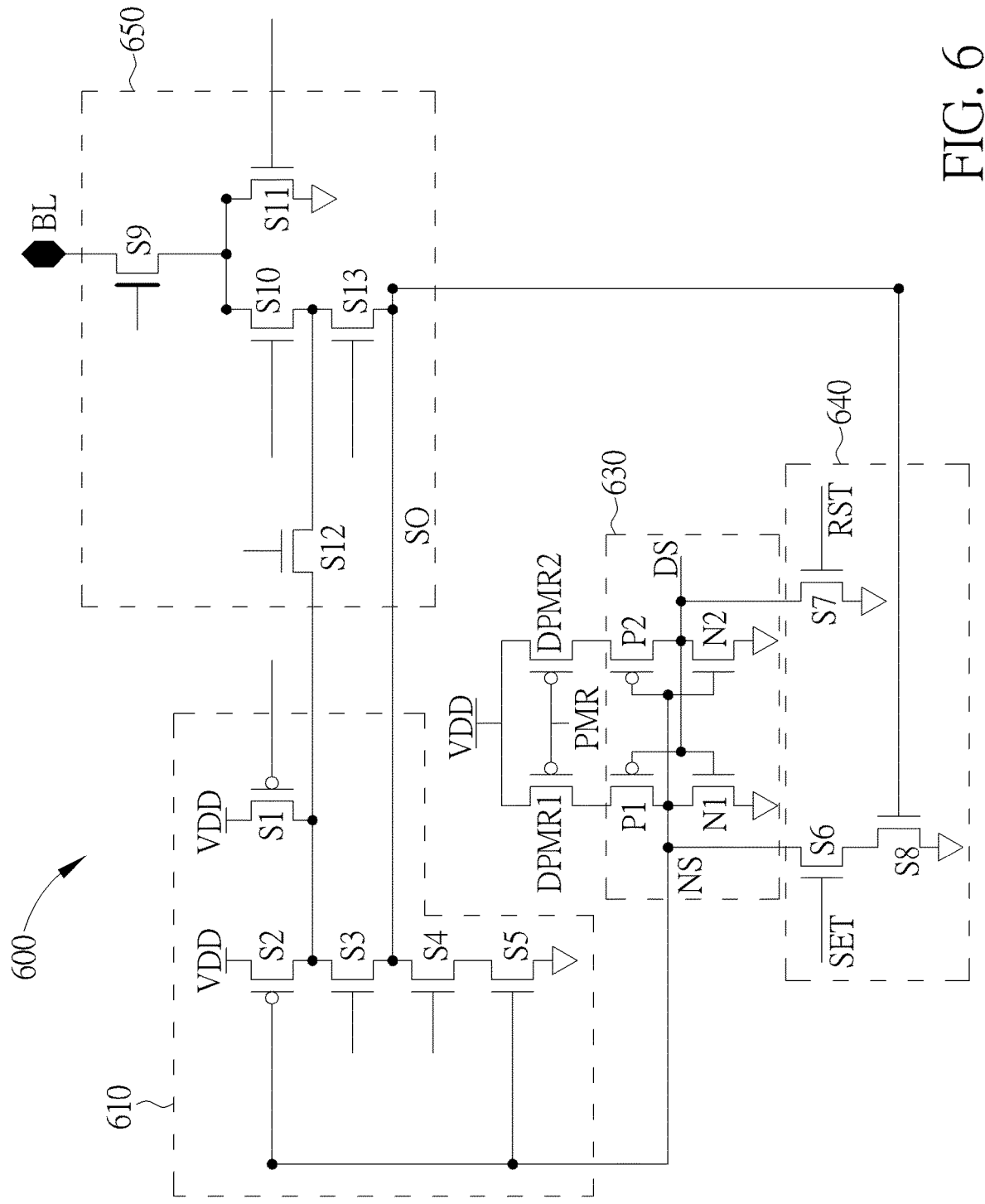
FIG. 6 is a diagram of a sense amplifier of another embodiment of the present invention.

FIG. 6 is a diagram of a sense amplifier 600 of another embodiment. The sense amplifier 600 comprises a charge circuit 610, a first current control transistor DPMR1, a second current control transistor DPMR2, an inverter circuit 630, an input circuit 640, and a sense circuit 650 coupled to a bitline BL and a sense node SO. The charge circuit 610 has the same configuration as the charge circuit 210. The input circuit 640 has the same configuration as the charge circuit 240. The sense circuit 650 has the same configuration as the sense circuit 250. Their circuit configurations would not be repeated here.

The first current control transistor DPMR1 comprises a first terminal coupled to the system voltage source VDD, a second terminal, and a control terminal configured to receive a current control signal PMR. The second current control transistor DPMR2 comprises a first terminal coupled to the system voltage source VDD, a second terminal, and a control terminal configured to receive a current control signal PMR. The first current control transistor DPMR1 and the second current control transistor DPMR2 are P-type transistors.

The inverter circuit 630 comprises a first P-type transistor P1, a first N-type transistor N1, a second P-type transistor P2 and a second N-type transistor N2. The first P-type transistor P1 comprises a first terminal coupled to the second terminal of the first current control transistor DPMR1, a second terminal coupled to a first latch node NS, and a control terminal coupled to a second latch node DS. The first N-type transistor N1 comprises a first terminal coupled to the first latch node NS, a second terminal coupled to the voltage ground GND, and a control terminal coupled to the second latch node DS. The second P-type transistor P2 comprises a first terminal coupled to the second terminal of the second current control transistor DPMR2, a second terminal coupled to the second latch node DS, and a control terminal coupled to the first latch node NS. The second N-type transistor N2 comprises a first terminal coupled to the second latch node DS, a second terminal coupled to the voltage ground GND and a control terminal coupled to the first latch node NS.

Figure 7:
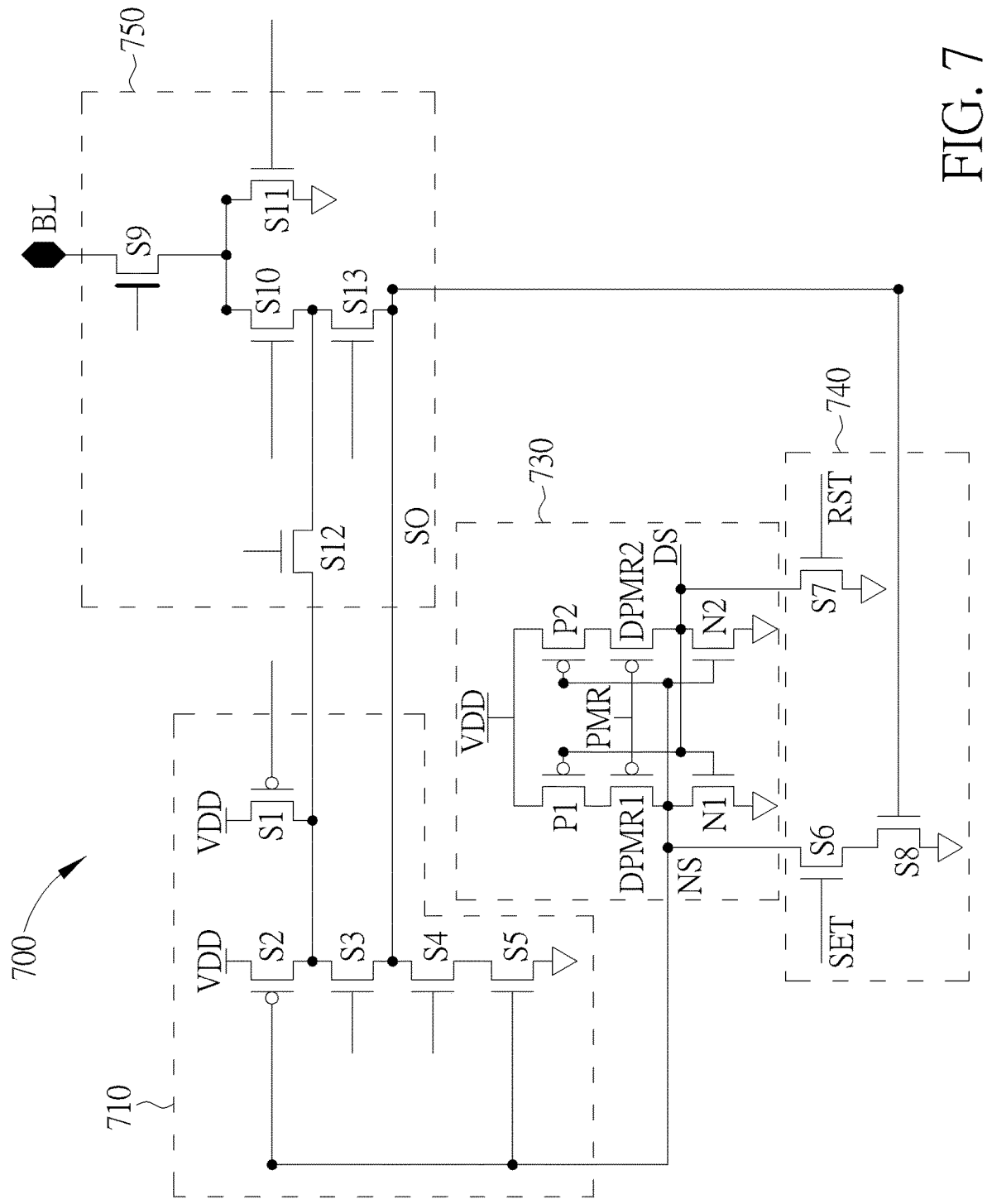
FIG. 7 is a diagram of a sense amplifier of another embodiment of the present invention.

FIG. 7 is a diagram of a sense amplifier 700 of another embodiment. The sense amplifier 700 comprises a charge circuit 710, an inverter circuit 730, an input circuit 740, and a sense circuit 750 coupled to a bitline BL and a sense node SO. The charge circuit 710 has the same configuration as the charge circuit 210. The input circuit 740 has the same configuration as the charge circuit 240. The sense circuit 750 has the same configuration as the sense circuit 250. Their circuit configurations would not be repeated here.

The inverter circuit comprises a first P-type transistor P1, a first N-type transistor N1, a second P-type transistor P2, a second N-type transistor N2, a first current control transistor DPMR1 and a second current control transistor DPMR2. The first current control transistor DPMR1 comprises a first terminal, a second terminal coupled to a first latch node NS, and a control terminal configured to receive a current control signal PMR. The second current control transistor DPMR2 comprises a first terminal, a second terminal coupled to a second latch node DS, and a control terminal configured to receive the current control signal PMR. The first P-type transistor P1 comprises a first terminal coupled to the system voltage source VDD, a second terminal coupled to the first terminal of the first current control transistor DPMR1, and a control terminal coupled to the second latch node DS. The first N-type transistor N1 comprises a first terminal coupled to the first latch node NS, a second terminal coupled to the voltage ground GND, and a control terminal coupled to the second latch node DS. The second P-type transistor P2 comprises a first terminal coupled to the system voltage source VDD, a second terminal coupled to the first terminal of the second current control transistor DPMR2, and a control terminal coupled to the first latch node NS. The second N-type transistor N2 comprises a first terminal coupled to the second latch node DS, a second terminal coupled to the voltage ground GBD, and a control terminal coupled to the first latch node NS. The first current control transistor DPMR1 and the second current control transistor DPMR2 are P-type transistors. The first latch node NS is coupled to the control end of the fifth switch S5.

The operating principle of the sense amplifier 600 and 700 is the same as that of the sense amplifier 200. Therefore, the signal diagram of FIGS. 4 and 5 also apply to the sense amplifier 600 and 700. The detail description of the operational signals will not be repeated here.

Figure 8:
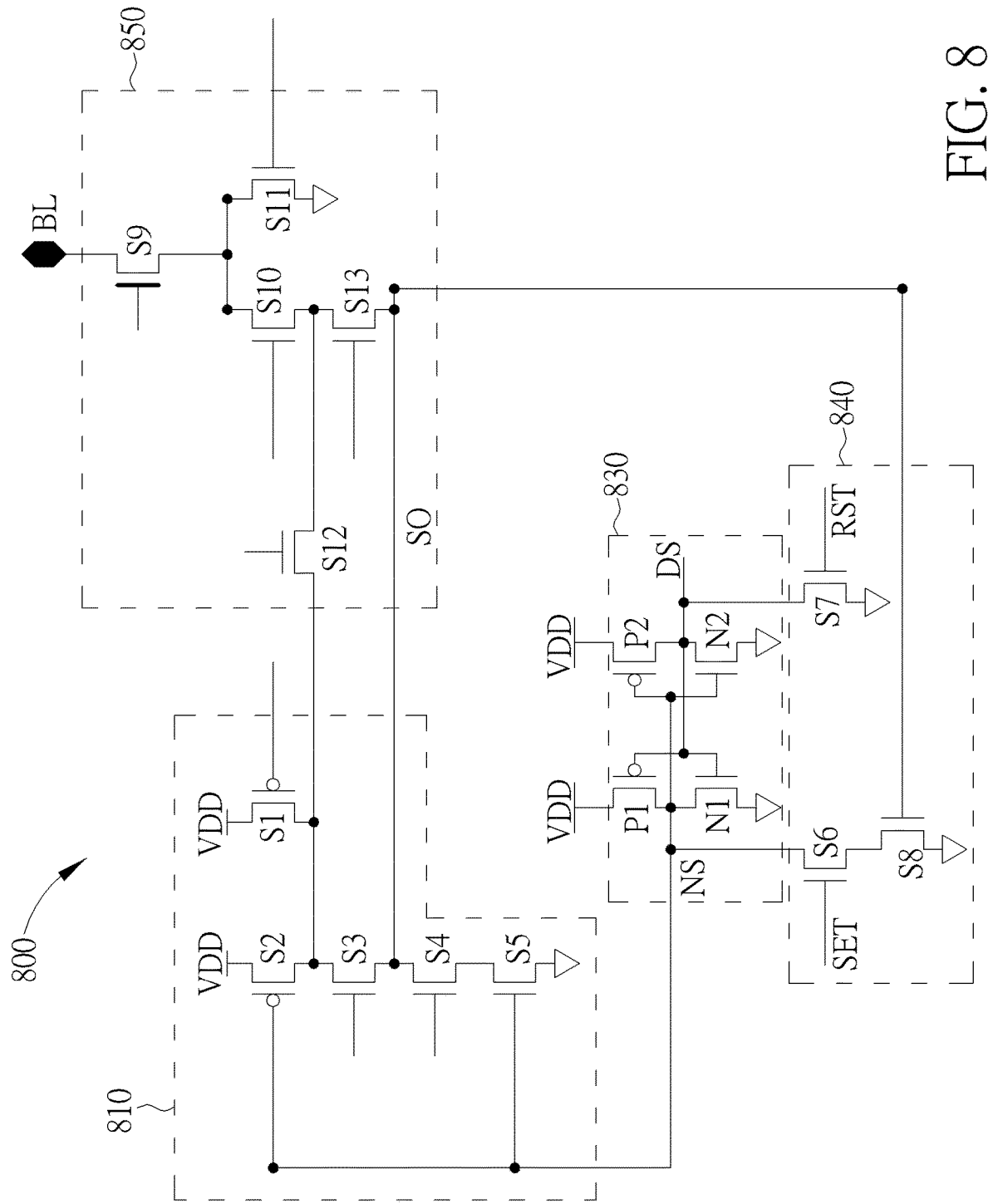
FIG. 8 is a diagram of a sense amplifier of another embodiment of the present invention.

FIG. 8 is a diagram of a sense amplifier 800 of another embodiment. The sense amplifier 800 comprises a charge circuit 810, an inverter circuit 830, an input circuit 840, and a sense circuit 850. The operating principle of the sense amplifier 800 is the same as that of the sense amplifier 200. The difference between the sense amplifier 800 and the sense amplifier 200 is that in sense amplifier 800, the first terminal of the first P-type transistor P1 and the first terminal of the second P-type transistor P2 are coupled to the system voltage source VDD. This circuit would only use switch S3 to control the initial voltage $V_{int}$ of the sense node SO to track the trip point voltage $V_{trp}$ of the sense amplifier 800. The switch S3 is an N-type transistor because only N-type transistor can realize this feature.

Figure 9:
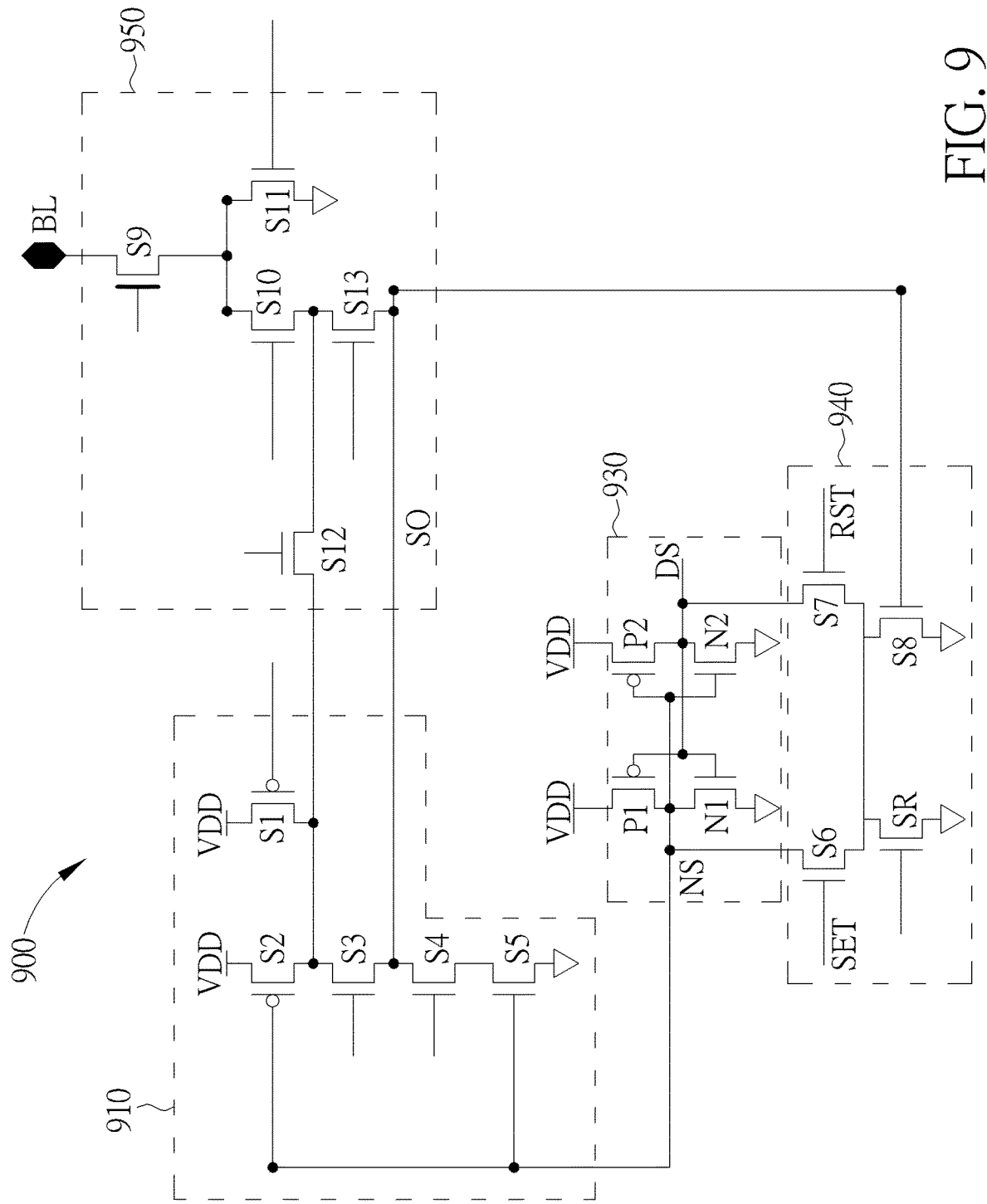
FIG. 9 is a diagram of a sense amplifier of another embodiment of the present invention.

FIG. 9 is a diagram of a sense amplifier 900 of another embodiment. The sense amplifier 900 comprises a charge circuit 910, an inverter circuit 930, an input circuit 940, and a sense circuit 950. The operating principle of the sense amplifier 900 is the same as that of the sense amplifier 800. The difference between the sense amplifier 900 and the sense amplifier 800 is that in sense amplifier 900, an additional reset switch SR is added. The reset switch SR comprises a first end coupled to the second end of the sixth switch S6, and a second end coupled to the voltage ground GND. Also the first end of the eighth switch S8 is coupled to the second end of the seventh switch S7 and the second end is coupled to the voltage ground GND.

In summary, the sense amplifier of the embodiments of the present invention can achieve better robustness towards any variation in temperature, supply voltage and semiconductor process. Therefore, comparing with the prior art, the embodiments can give more accurate sensing results for flash memory devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A sense amplifier comprising:
a sense circuit coupled to a bitline and a sense node;
a charge circuit comprising:
  a first switch comprising:
    a first end coupled to a system voltage source; and
    a second end coupled to the sense circuit;
  a second switch comprising:
    a first end coupled to the system voltage source;
    a second end coupled to the second end of the first switch; and
    a control end;
  a third switch comprising:
    a first end coupled to the second end of the second switch; and
    a second end coupled to the sense node;
  a fourth switch comprising:
    a first end coupled to the sense node; and
    a second end; and
  a fifth switch comprising:
    a first end coupled to the second end of the fourth switch;
    a second end coupled to a voltage ground; and
    a control end coupled to the control end of the second switch;
  wherein the third switch is an N-type transistor;
an inverter circuit driven by system voltage source, comprising:
  a first latch node coupled to the control end of the fifth switch; and
  a second latch node; and
an input circuit coupled to the first latch node, the second latch node and the sense node.
2. The sense amplifier of claim 1, further comprising:
a first current control transistor comprising:
  a first terminal coupled to the system voltage source;
  a second terminal; and
  a control terminal configured to receive a current control signal;

wherein the first current control transistor is a P-type transistor and the system voltage source is coupled to the first current control transistor for driving the inverter circuit.

3. The sense amplifier of claim 2, wherein the inverter circuit comprises:
a first P-type transistor comprising:
a first terminal coupled to the second terminal of the first current control transistor;
a second terminal coupled to the first latch node; and
a control terminal coupled to the second latch node;
a first N-type transistor comprising:
a first terminal coupled to the first latch node;
a second terminal coupled to the voltage ground; and
a control terminal coupled to the second latch node;
a second P-type transistor comprising:
a first terminal coupled to the second terminal of the first current control transistor;
a second terminal coupled to the second latch node; and
a control terminal coupled to the first latch node; and
a second N-type transistor comprising:
a first terminal coupled to the second latch node;
a second terminal coupled to the voltage ground; and
a control terminal coupled to the first latch node.

4. The sense amplifier of claim 3, wherein the input circuit comprises:
a sixth switch comprising:
a first end coupled to the first latch node; and
a second end;
a seventh switch comprising:
a first end coupled to the second latch node; and
a second end coupled to the voltage ground;
an eighth switch comprising:
a first end coupled to the second end of the sixth switch;
a second end coupled to the voltage ground; and
a control end coupled to the sense node;
wherein the sixth switch, the seventh switch and the eighth switch are N-type transistors.

5. The sense amplifier of claim 1, wherein the inverter circuit comprises:
a first P-type transistor comprising:
a first terminal coupled to the system voltage source;
a second terminal coupled to the first latch node; and
a control terminal coupled to the second latch node;
a first N-type transistor comprising:
a first terminal coupled to the first latch node;
a second terminal coupled to the voltage ground; and
a control terminal coupled to the second latch node;
a second P-type transistor comprising:
a first terminal coupled to the system voltage source;
a second terminal coupled to the second latch node; and
a control terminal coupled to the first latch node; and
a second N-type transistor comprising:
a first terminal coupled to the second latch node;
a second terminal coupled to the voltage ground; and
a control terminal coupled to the first latch node.

6. The sense amplifier of claim 5, wherein the input circuit comprises:
a sixth switch comprising:
a first end coupled to the first latch node; and
a second end;
a seventh switch comprising:
a first end coupled to the second latch node; and
a second end coupled to the voltage ground;
an eighth switch comprising:
a first end coupled to the second end of the sixth switch;
a second end coupled to the voltage ground; and
a control end coupled to the sense node;
wherein the sixth switch, the seventh switch and the eighth switch are N-type transistors.

7. The sense amplifier of claim 6, wherein the input circuit comprises:
a sixth switch comprising:
a first end coupled to the first latch node; and
a second end;
a seventh switch comprising:
a first end coupled to the second latch node; and
a second end;
an eighth switch comprising:
a first end coupled to the second end of the seventh switch;
a second end coupled to the voltage ground; and
a control end coupled to the sense node;
an reset switch comprising:
a first end coupled to the second end of the sixth switch; and
a second end coupled to the voltage ground;
wherein the sixth switch, the seventh switch, the eighth switch and the reset switch are N-type transistors.

8. The sense amplifier of claim 1, wherein the sense circuit comprises:
a ninth switch comprising:
a first end coupled to the bitline; and
a second end;
a tenth switch comprising:
a first end coupled to the second end of the ninth switch; and
a second end;
an eleventh switch comprising:
a first end coupled to the second end of the ninth switch; and
a second end coupled to the voltage ground;
a twelfth switch comprising:
a first end coupled to the second end of the first switch; and
a second end coupled to the second end of the tenth switch; and
a thirteenth switch comprising:
a first end coupled to the second end of the tenth switch; and
a second end coupled to the sense node;
wherein the ninth switch, the tenth switch, the eleventh switch, the twelfth switch and the thirteenth switch are N-type transistors.

9. The sense amplifier of claim 1, wherein the first switch and the second switch are P-type transistors, and the fourth switch and the fifth switch are N-type transistors.

10. A sense amplifier comprising:
a sense circuit coupled to a bitline and a sense node;
a charge circuit comprising:
a first switch comprising:
a first end coupled to a system voltage source; and
a second end coupled to the sense circuit;
a second switch comprising:
a first end coupled to the system voltage source;
a second end coupled to the second end of the first switch; and
a control end;
a third switch comprising:
a first end coupled to the second end of the second switch; and
a second end coupled to the sense node;

a fourth switch comprising:
  a first end coupled to the sense node; and
  a second end; and
a fifth switch comprising:
  a first end coupled to the second end of the fourth switch;
  a second end coupled to a voltage ground; and
  a control end coupled to the control end of the second switch;
wherein the third switch is an N-type transistor;
a first current control transistor comprising:
  a first terminal coupled to the system voltage source;
  a second terminal; and
  a control terminal configured to receive a current control signal; and
a second current control transistor comprising:
  a first terminal coupled to the system voltage source;
  a second terminal; and
  a control terminal configured to receive the current control signal;
  wherein the first current control transistor and the second current control transistor are P-type transistors;
an inverter circuit coupled to the second terminal of the first current control transistor and to the second terminal of the second current control transistor, comprising:
  a first latch node coupled to the control end of the fifth switch; and
  a second latch node; and
an input circuit coupled to the first latch node, the second latch node and the sense node.

11. The sense amplifier of claim 10, wherein the inverter circuit comprises:
a first P-type transistor comprising:
  a first terminal coupled to the second terminal of the first current control transistor;
  a second terminal coupled to the first latch node; and
  a control terminal coupled to the second latch node;
a first N-type transistor comprising:
  a first terminal coupled to the first latch node;
  a second terminal coupled to the voltage ground; and
  a control terminal coupled to the second latch node;
a second P-type transistor comprising:
  a first terminal coupled to the second terminal of the second current control transistor;
  a second terminal coupled to the second latch node; and
  a control terminal coupled to the first latch node; and
a second N-type transistor comprising:
  a first terminal coupled to the second latch node;
  a second terminal coupled to the voltage ground; and
  a control terminal coupled to the first latch node.

12. The sense amplifier of claim 11, wherein the input circuit comprises:
a sixth switch comprising:
  a first end coupled to the first latch node; and
  a second end;
a seventh switch comprising:
  a first end coupled to the second latch node; and
  a second end coupled to the voltage ground;
an eighth switch comprising:
  a first end coupled to the second end of the sixth switch;
  a second end coupled to the voltage ground; and
  a control end coupled to the sense node;
wherein the sixth switch, the seventh switch and the eighth switch are N-type transistors.

13. The sense amplifier of claim 10, wherein the sense circuit comprises:
a ninth switch comprising:
  a first end coupled to the bitline; and
  a second end;
a tenth switch comprising:
  a first end coupled to the second end of the ninth switch; and
  a second end;
an eleventh switch comprising:
  a first end coupled to the second end of the ninth switch; and
  a second end coupled to the voltage ground;
a twelfth switch comprising:
  a first end coupled to the second end of the first switch; and
  a second end coupled to the second end of the tenth switch; and
a thirteenth switch comprising:
  a first end coupled to the second end of the tenth switch; and
  a second end coupled to the sense node;
wherein the ninth switch, the tenth switch, the eleventh switch, the twelfth switch and the thirteenth switch are N-type transistors.

14. The sense amplifier of claim 10, wherein the first switch and the second switch are P-type transistors, and the fourth switch and the fifth switch are N-type transistors.

15. A sense amplifier comprising:
a sense circuit coupled to a bitline and a sense node;
a charge circuit comprising:
  a first switch comprising:
    a first end coupled to a system voltage source; and
    a second end coupled to the sense circuit;
  a second switch comprising:
    a first end coupled to the system voltage source;
    a second end coupled to the second end of the first switch; and
    a control end;
  a third switch comprising:
    a first end coupled to the second end of the second switch; and
    a second end coupled to the sense node;
  a fourth switch comprising:
    a first end coupled to the sense node; and
    a second end; and
  a fifth switch comprising:
    a first end coupled to the second end of the fourth switch;
    a second end coupled to a voltage ground; and
    a control end coupled to the control end of the second switch;
wherein the third switch is an N-type transistor;
an inverter circuit comprising:
  a first current control transistor comprising:
    a first terminal;
    a second terminal coupled to a first latch node; and
    a control terminal configured to receive a current control signal;
  a second current control transistor comprising:
    a first terminal;
    a second terminal coupled to a second latch node; and
    a control terminal configured to receive the current control signal;
  a first P-type transistor comprising:
    a first terminal coupled to the system voltage source;
    a second terminal coupled to the first terminal of the first current control transistor; and a control terminal coupled to the second latch node;
a first N-type transistor comprising:
a first terminal coupled to the first latch node;
a second terminal coupled to the voltage ground; and
a control terminal coupled to the second latch node;
a second P-type transistor comprising:
a first terminal coupled to the system voltage source;
a second terminal coupled to the first terminal of the second current control transistor; and
a control terminal coupled to the first latch node;
a second N-type transistor comprising:
a first terminal coupled to the second latch node;
a second terminal coupled to the voltage ground; and
a control terminal coupled to the first latch node;
wherein the first current control transistor and the second current control transistor are P-type transistors, and
the first latch node is coupled to the control end of the fifth switch; and
an input circuit coupled to the first latch node, the second latch node and the sense node.

16. The sense amplifier of claim 15, wherein the input circuit comprises:
a sixth switch comprising:
a first end coupled to the first latch node; and
a second end;
a seventh switch comprising:
a first end coupled to the second latch node; and
a second end coupled to the voltage ground;
an eighth switch comprising:
a first end coupled to the second end of the sixth switch;
a second end coupled to the voltage ground; and
a control end coupled to the sense node;
wherein the sixth switch, the seventh switch and the eighth switch are N-type transistors.

17. The sense amplifier of claim 16, wherein the sense circuit comprises:
a ninth switch comprising:
a first end coupled to the bitline; and
a second end;
a tenth switch comprising:
a first end coupled to the second end of the ninth switch; and
a second end;
an eleventh switch comprising:
a first end coupled to the second end of the ninth switch; and
a second end coupled to the voltage ground;
a twelfth switch comprising:
a first end coupled to the second end of the first switch; and
a second end coupled to the second end of the tenth switch; and
a thirteenth switch comprising:
a first end coupled to the second end of the tenth switch; and
a second end coupled to the sense node;
wherein the ninth switch, the tenth switch, the eleventh switch, the twelfth switch and the thirteenth switch are N-type transistors.

18. The sense amplifier of claim 15, wherein the first switch and the second switch are P-type transistors, and the fourth switch and the fifth switch are N-type transistors.

* * * * *